United States Patent [19]
Takeshita

[11] Patent Number: 6,110,568
[45] Date of Patent: Aug. 29, 2000

[54] THIN FILM CIRCUIT SUBSTRATE AND PROCESS FOR THE MANUFACTURE THEREOF

[75] Inventor: Shuji Takeshita, Kawasaki, Japan

[73] Assignee: Fujitsu Limited, Kawasaki, Japan

[21] Appl. No.: 08/302,085

[22] Filed: Sep. 7, 1994

Related U.S. Application Data

[63] Continuation of application No. 08/142,110, Oct. 28, 1993, abandoned, which is a continuation of application No. 07/832,348, Feb. 7, 1992, abandoned.

[30] Foreign Application Priority Data

Feb. 7, 1991 [JP] Japan .................................. 3-016355

[51] Int. Cl.$^7$ ...................................................... B32B 3/00
[52] U.S. Cl. .......................... 428/209; 428/458; 428/901; 174/251; 174/258; 174/259
[58] Field of Search .................................. 428/209, 458, 428/901; 174/251, 258, 259

[56] References Cited

U.S. PATENT DOCUMENTS

| 4,647,508 | 3/1987 | Gazit et al. ............................... 428/421 |
| 4,758,476 | 7/1988 | Sekine et al. ............................ 428/432 |
| 4,931,354 | 6/1990 | Wakino et al. . | |

FOREIGN PATENT DOCUMENTS

| 0 233 085 | 8/1987 | European Pat. Off. . |
| 0 393 635 | 10/1990 | European Pat. Off. . |

OTHER PUBLICATIONS

Harwood, J., "TEFLON AF—A New Polymer for Electronics", International Electronic Manufacturing Technology Symposium, Baveno, Italy, May 7–9, 1990, pp. 503–507.
Patent Abstracts of Japan, vol. 14, No. 89, Feb. 19, 1990 for JP–A–1298764.
Patent Abstracts of Japan, vol. 10, No. 217, Jul. 29, 1986 for JP–A–61054674.
Doo et al., "Low–Capacitance, Monolithic Integrated Circuit", *IBM Technical Disclosure Bulletin,* vol. 9, No. 9, Feb. 1967.
Cottrell et al., "VLSI Wiring capacitance", *IBM Journal of Research and Development,* vol. 29, No. 3, May 1985, pp. 277–288.
Central Patents Index, Basic Abstracts Journal, Derwent Publications Ltd., London, AN 7913001B for JP–A–54002667.
European Search Report, The Hague, Nov. 24, 1992.
European Search Report for European Patent Application No. 92 300 985 dated Feb. 29, 1996.

*Primary Examiner*—Cathy F. Lam
*Attorney, Agent, or Firm*—Staas & Halsey, LLP

[57] ABSTRACT

A thin film circuit substrate comprising multilayer conductor layers formed via insulating layers, wherein a signal transmission path in at least one of the conductor layers is embedded in a low dielectric constant insulator, and the low dielectric constant insulator is embedded in an insulator layer with a good adhesiveness. The thin film circuit substrate attains a low dielectric constant, and thus an improved signal propagation velocity, without lowering the interlayer adhesiveness.

4 Claims, 8 Drawing Sheets

THIN FILM CIRCUIT SUBSTRATE AND PROCESS FOR THE MANUFACTURE THEREOF

This application is a continuation of application Ser. No. 08/142,110, filed Oct. 28, 1993, now abandoned. This application is a continuation of application Ser. No. 07/832,348, filed Feb. 7, 1992, now abandoned.

BACKGROUND OF THE INVENTION

1. Field of the Invention

The present invention relates to a thin film circuit substrate and a process for the manufacture thereof.

2. Description of the Related Art

In recent years, the demand for an acceleration of the processing speed of electronic devices, including computers, has led to a requirement for an acceleration of a signal propagation velocity of a microstrip line on a circuit substrate.

As is widely known, the signal propagation velocity of a circuit line is decided by the dielectric constant of an insulator thereof, and thus various circuit substrates using an insulator with a low dielectric constant have been proposed.

As an insulating material used for a thin film circuit substrate for accelerating the signal propagation velocity thereof, there have been proposed fluorinated polyimides (dielectric constant=2.7), fluoropolymers such as PTFE (dielectric constant=2.1) or amorphous fluoropolymers such as Teflon AF (dielectric constant=2.0 or less), having a dielectric constant lower than those of the usual, widely-used polyimides (dielectric constant=3.3).

The above-described low dielectric constant materials, however, have a defect in that the adhesion thereof to a substrate is low, and further, these materials cannot be applied to a substrate in a large thickness. Furthermore, since Teflon AF materials are damaged by a fluorine organic solvent, these materials have a drawback in that serious defects arise when they are washed after having been soldered, or when a VPS (vapor phase soldering) is applied thereto.

Figure 26:
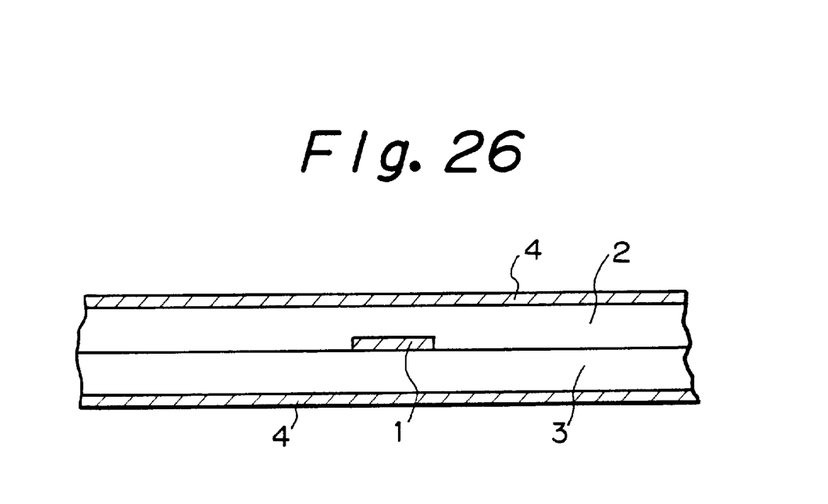
FIG. 26 is an illustration showing an example of a conventional thin film circuit substrate.

To solve the above-described problem, a method as illustrated in FIG. 26 may be considered, in which a signal transmission path 1 is sandwiched between an insulator layer 3 made of a normal polyimide with a high adhesion and an insulating layer 2 made of an insulator with a low dielectric constant, whereby an insulating layer is formed. Even by a constitution such as described above, however, a reduction of the dielectric constant can be obtained only to a degree such that the dielectric constant of the finally obtained insulator is reduced at most to about the average value of the dielectric constants of the insulator layer 3 and the insulator 2, and further, such a constitution has a defect of problems with the adhesion strength thereof. In FIG. 26, reference numeral 4 indicates a ground layer.

SUMMARY OF THE INVENTION

The present invention has an object of eliminating the above-described defects; thus, to provide a thin film circuit substrate having a higher dielectric constant reduction, without a lowering of the interlayer adhesion, and a process for the manufacture thereof.

According to the present invention, the above-described object is attained by providing a thin film circuit substrate comprising multilayer conductor layers formed via insulating layers, wherein a signal transmission path in at least one of said conductor layers is embedded in a low dielectric constant insulator, and said low dielectric constant insulator is embedded in an insulator layer with a good adhesiveness.

DESCRIPTION OF THE PREFERRED EMBODIMENTS

The present invention will now be described in detail with reference to the attached drawings.

Figure 1:
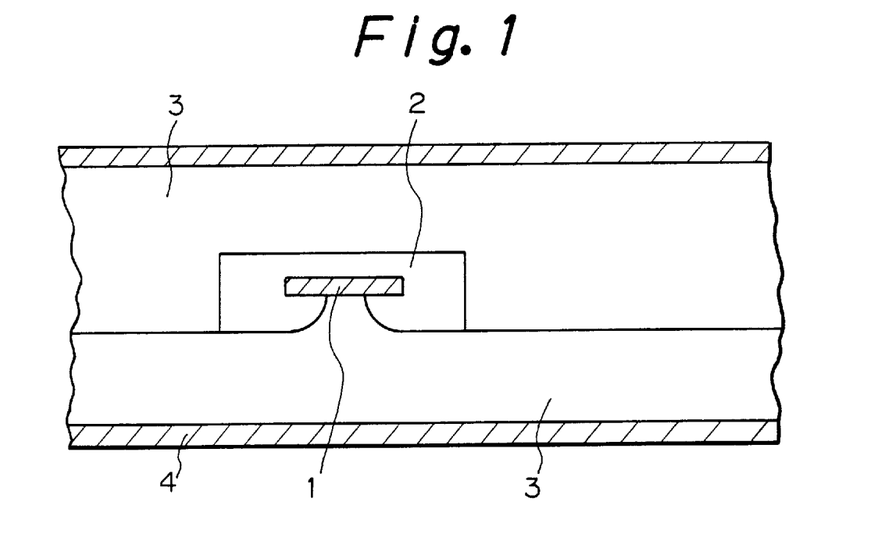
FIG. 1 is a schematic illustration showing an embodiment of the thin film circuit substrate according to the present invention.

The thin film circuit substrate according to the present invention, as shown in FIG. 1, can be obtained by a process as illustrated in FIGS. 2 through 10, comprising the steps of:

eliminating, by an isotropic etching means, a surface layer of an insulator layer (3) with a good adhesiveness and having a signal transmission path (1) formed thereon, except for at least a portion supporting the signal transmission path (1) in an undercut state, and then coating the thus-etched insulator layer with a low dielectric constant insulator (2); and subsequently eliminating, by etching, said low dielectric constant insulator (2), except for the circumference of said signal transmission path (1), and then coating the thus-etched insulator (2) with a layer (3) of an insulating material with a good adhesiveness.

According to the above-described constitution, the signal transmission path 1 is embedded in the low dielectric constant insulator 2, whereby a substantially low dielectric constant is obtained.

Further, the low dielectric constant insulator 2, which generally has inferior adhesiveness, is embedded in an insulator with good adhesiveness, whereby characteristics of these insulators compensate each other.

Figure 2:
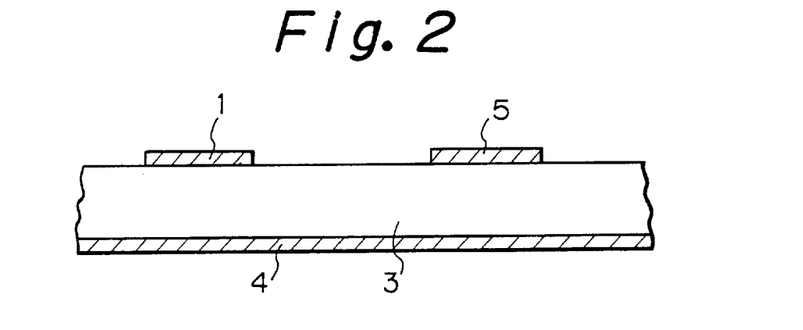
FIGS. 2 through 10 are schematic illustrations showing a process for the manufacture of the substrate as shown in FIG. 1.

A process for the manufacture of the thin film circuit substrate as shown in FIG. 1 is illustrated in FIGS. 2 through 10. First, a ground layer 4 is coated with a polyimide having a good adhesiveness, and in general, a high dielectric constant, whereby an insulator layer 3 is formed as illustrated in FIG. 2. The coated polyimide is a polyimide generally utilized in usual thin film formation processes.

Subsequently, on the surface layer of the above-described insulator layer 3 is formed a conductor layer, through a known step such as sputtering or etching. This conductor layer is composed of a plurality of signal transmission paths 1 and lands 5, for an interlayer contact. FIG. 2 illustrates a signal transmission path 1 on the left side, and a land 5 for interlayer contact on the right side.

Thereafter the insulator layer 3 having a conductor layer formed on the surface layer thereof as described above, is subjected to an isotropic etching by a wet etching method using, e.g., hydrazine, or a dry etching method such as plasma etching, using as a mask the signal transmission path 1 and the land 5 for interlayer contact.

Figure 3:
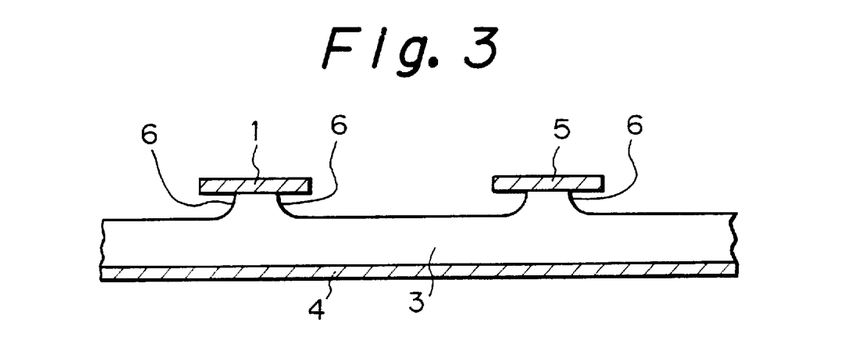

The isotropic etching, by which the etching proceeds in all the directions, causes the above-described insulator layer 3 to be cut out inward from the outer circumferential edges of the signal transmission path 1 and the land 5 for interlayer contact, and accordingly, as illustrated in FIG. 3, a conductor layer in an undercut state, and on the reverse side of which the central portion alone is supported by the insulator layer 3 and the ends thereof are not supported, is obtained. Subsequently, the low dielectric constant insulator 2 made of a material such as a fluorinated polyimide, amorphous fluoropolymer or perfluorinated polyalkylamine is coated over the entire surface of the thus-obtained conductor layer.

Figure 4:
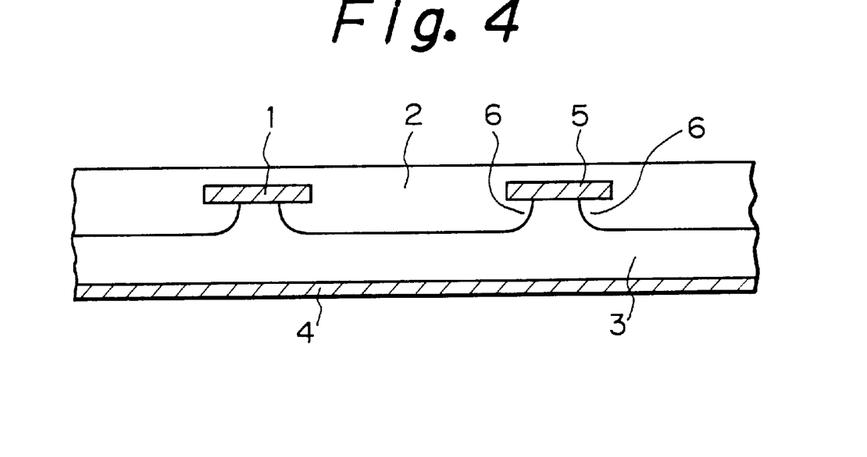

The above-described formation of the low dielectric constant insulator layer 2 is achieved by utilizing the known spin coating method, etc., whereby the undercut portions 6 are filled with the low dielectric constant insulator 2 as illustrated in FIG. 4.

Figure 5:
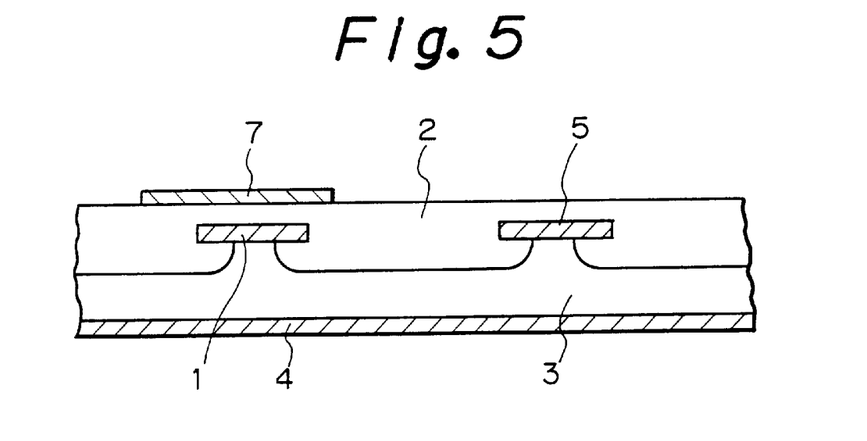
Figure 6:
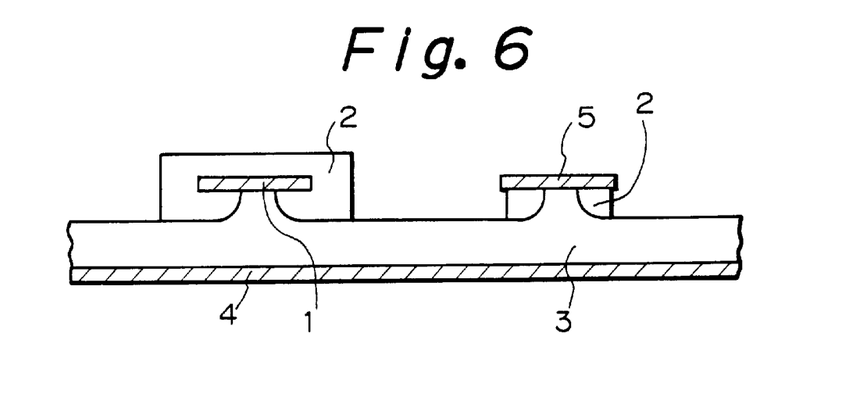
Figure 7:
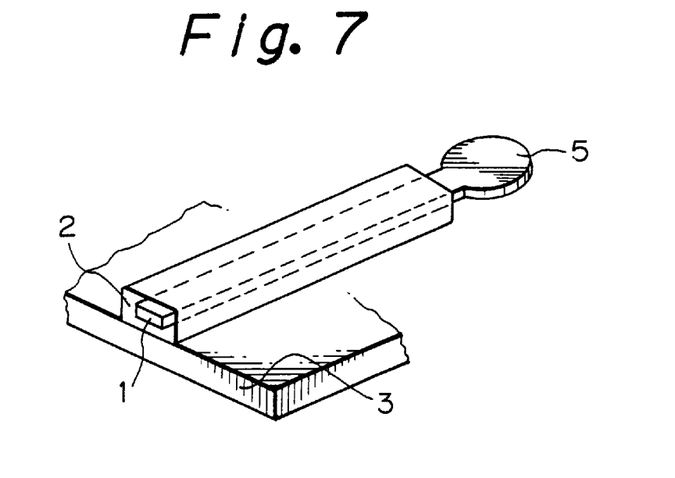

Subsequently, as illustrated in FIG. 5, a resist 7 is applied to the low dielectric constant insulator layer 2, at a portion thereof corresponding to the signal transmission path 1, and thereafter, the low dielectric constant insulator layer 2 is etched by RIE (Reactive Ion Etching) and eliminated except for the circumference of the signal transmission path 1 and the portion of the insulator layer 2 penetrating the undercut portions 6, following which only the portion of the resist 7 above the signal transmission path 1 is peeled off, as illustrated in FIG. 6. In this state, a signal transmission path 1 embedded in the low dielectric constant insulator 2, as illustrated in FIG. 7, is obtained.

Figure 8:
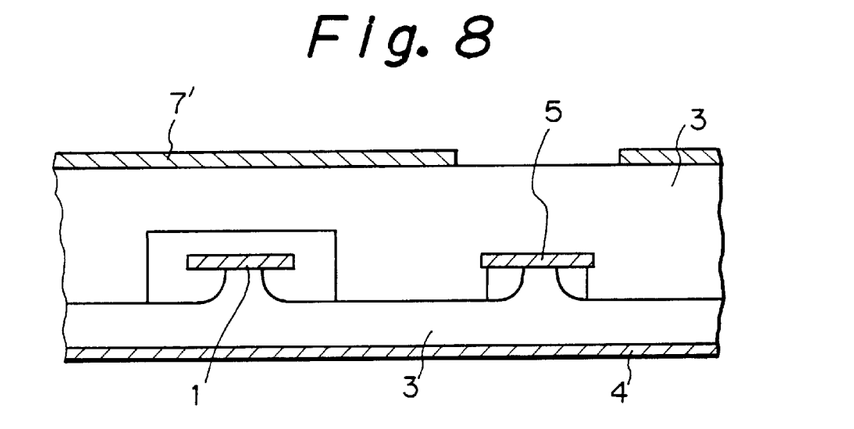
Figure 9:
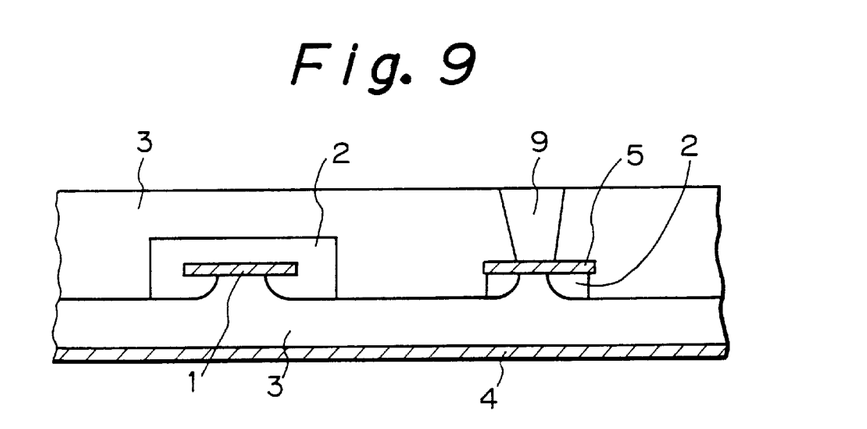

Thereafter, an insulator with good adhesiveness is coated over the entire low dielectric constant layer 2, whereby an insulator layer 3 is formed, and further, the thus-formed insulator 3 is selectively etched as shown in FIG. 8 to form a contact hole 9 above land 5 which provides a contact area as shown in FIG. 9. Reference numeral 7' in FIG. 8 indicates the resist to be applied for the etching. In this case, preferably the insulator is a photosensitive polyimide, to improve the etching efficiency for the contact hole 9.

Figure 10:
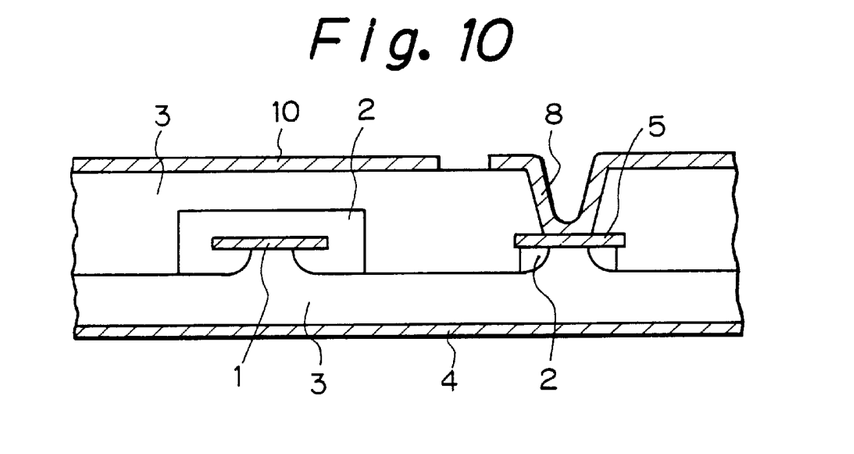

By this process, the circumference of the signal transmission path 1 is encircled by the low dielectric constant insulator 2, at almost all parts thereof, and the low dielectric constant insulator 2 having a poor adhesiveness is embedded in the insulator layer 3 with a good adhesiveness, whereby the adhesiveness of the combination of the insulator 2 and the insulator layer 3 is improved. Subsequently, a conductor layer is laminated on the entire surface of the insulator layer 3, and thereafter, a via 8 and an upper conductor layer 10 are formed by etching the conductor layer as illustrated in FIG. 10.

Figure 11:
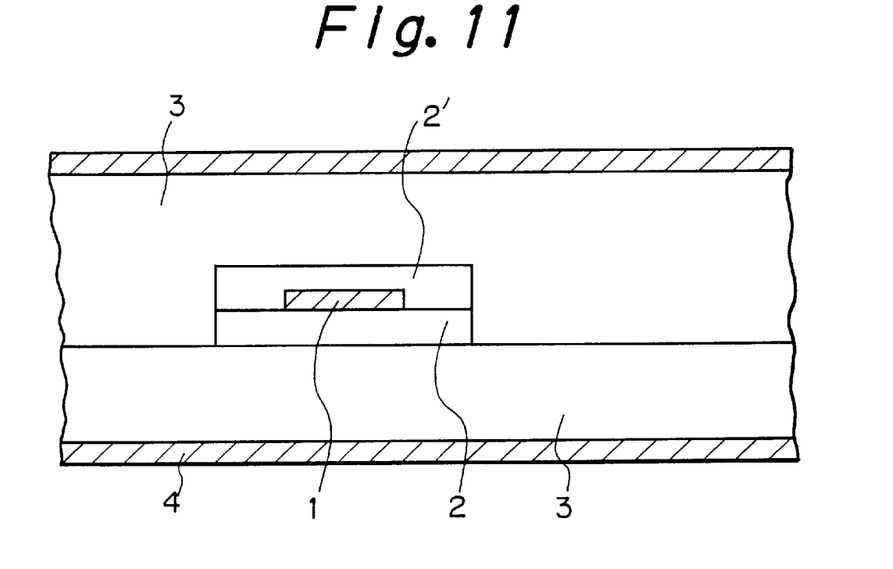
FIG. 11 is a schematic illustration showing another embodiment of the thin film circuit substrate according to the present invention.

Another embodiment of the thin film circuit substrate according to the present invention is schematically shown in FIG. 11. In this embodiment, the signal transmission path 1 is completely embedded in low dielectric constant insulators 2 and 2'.

Figure 12:
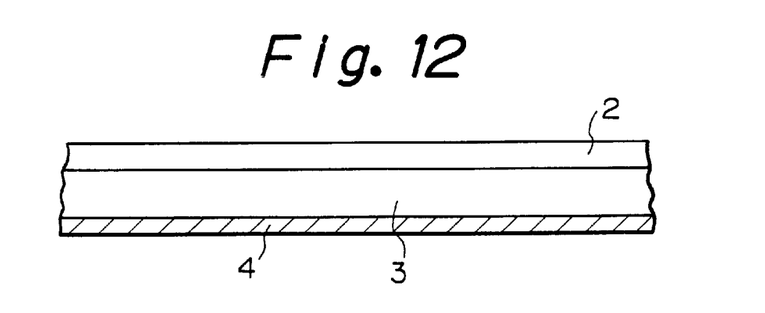
FIGS. 12 through 19 are schematic illustrations showing a process for the manufacture of the substrate as shown in FIG. 11.

The thin film circuit substrate as shown in FIG. 11 may be prepared by a process as illustrated in FIGS. 12 through 19. First, a polyimide is coated on a ground layer 4, to form an insulator layer 3, and then a low dielectric constant layer 2 is coated on the surface of the insulator layer 3, as illustrated in FIG. 12.

Figure 13:
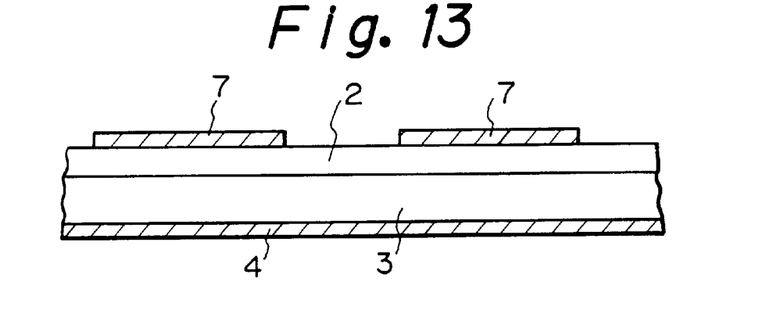
Figure 14:
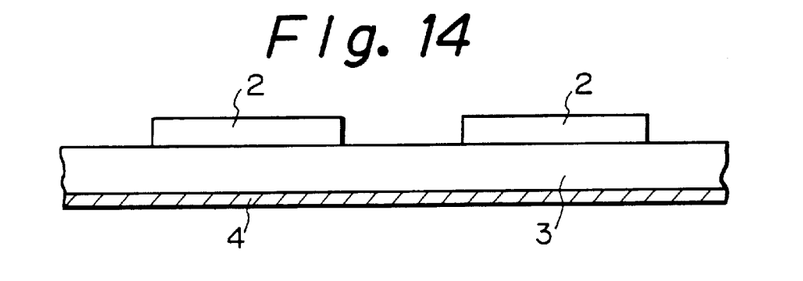
Figure 15:
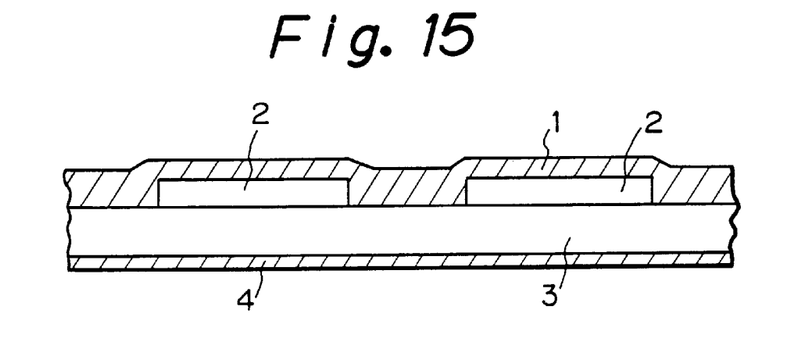
Figure 16:
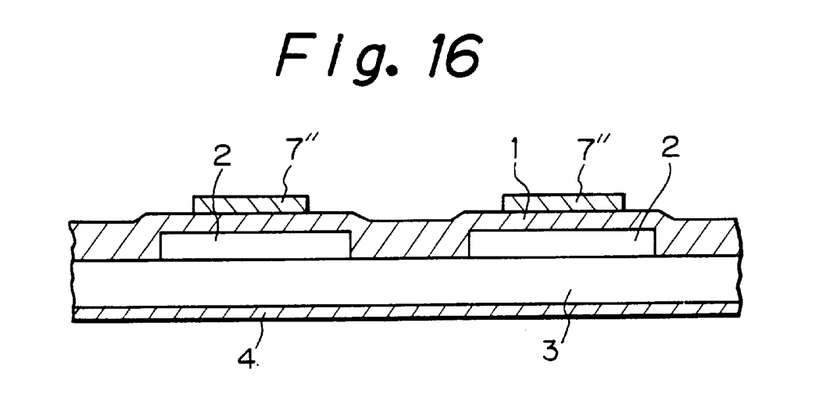

Thereafter, a resist 7 is applied as a pattern to the surface of the low dielectric constant layer 2, as illustrated in FIG. 13, and the low dielectric constant insulator layer 2 is etched to form a pattern as illustrated in FIG. 14. Then a metal layer 1 is formed over the overall surface, e.g., by sputtering, as illustrated in FIG. 15, and a resist pattern 7" is applied to the surface of the metal layer as illustrated in FIG. 16, whereby the metal layer is etched so that the signal transmission path 1 and the land 5 are formed as illustrated in FIG. 17, and then the resist 7" is removed.

Figures 17, 18:
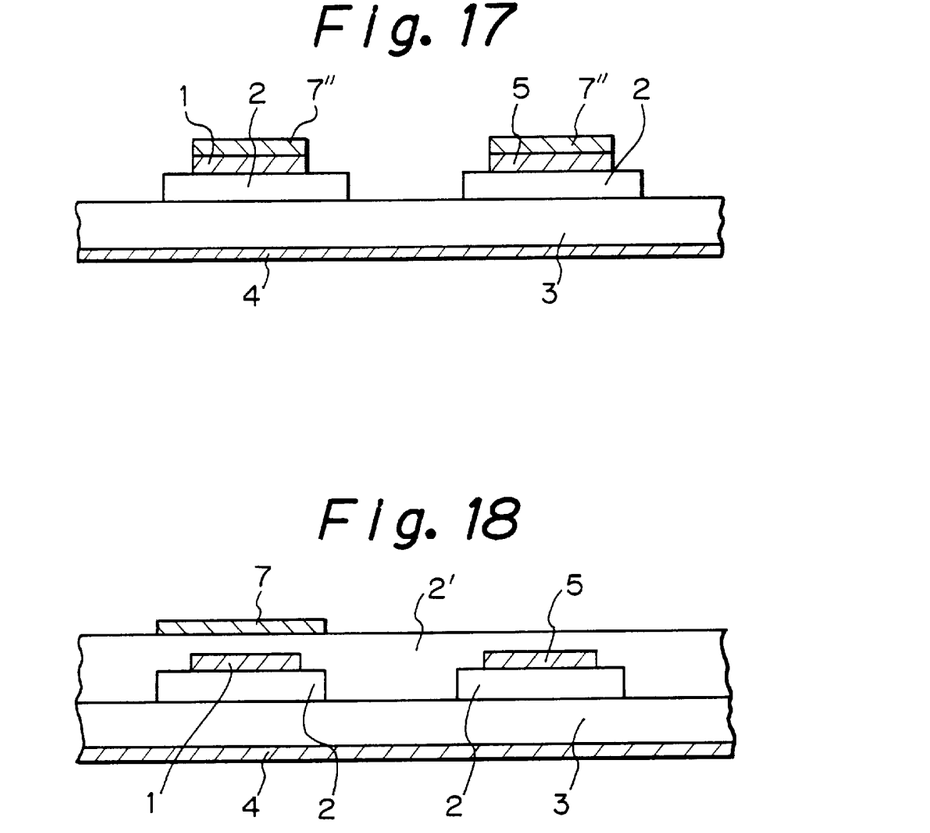
Figure 19:
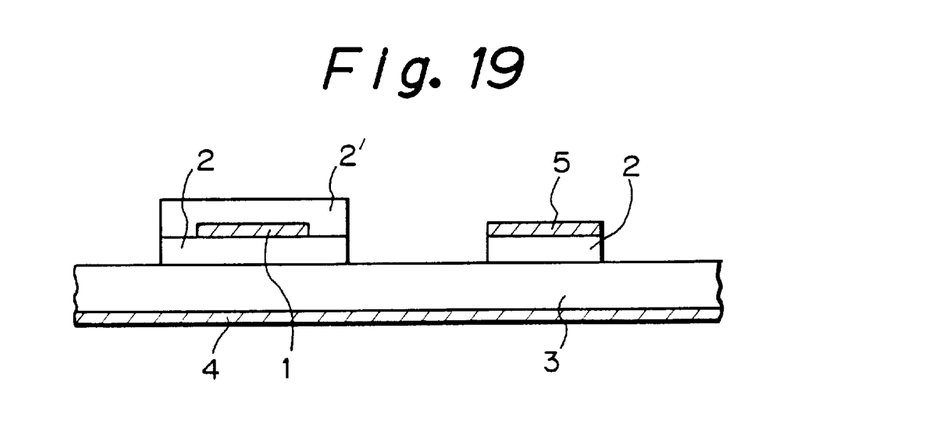

Thereafter, a low dielectric constant layer 2', which may be a same or different material to the material of the low dielectric constant layer 2, is formed over the overall surface, a resist 7 is applied to the surface of the low dielectric constant layer 2' as illustrated in FIG. 18, and then the low dielectric constant layer 2' is etched so that the signal transmission path 1 completely embedded in the material of the low dielectric constant layers 2 and 2', and the land 5 mounted on the low dielectric constant layer 2, are formed as shown in FIG. 19, which corresponds to the step shown in FIG. 6 in the above-mentioned first process embodiment. Thereafter, the steps illustrated in FIGS. 8 through 10 are repeated.

Figure 20:
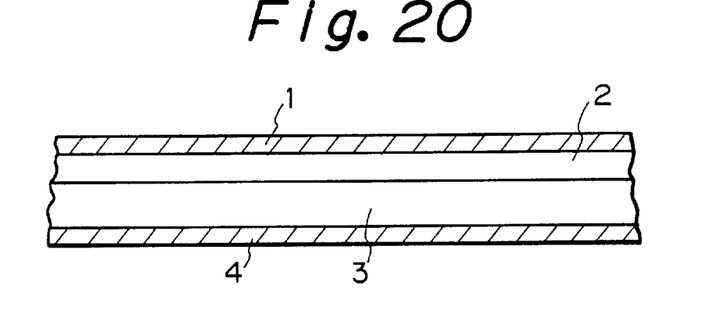
FIGS. 20 through 25 are schematic illustrations showing another process for the manufacture of the substrate as shown in FIG. 11.

The thin film circuit substrate as shown in FIG. 11 may be prepared by another process as illustrated in FIGS. 12 through 19. First, a polyimide is coated on a ground layer 4, to form an insulator layer 3, and then a low dielectric constant layer 2 is coated on the surface of the insulator layer 3 and a metal layer 1 is formed on the surface of the low dielectric constant layer 2, as illustrated in FIG. 20.

Figure 21:
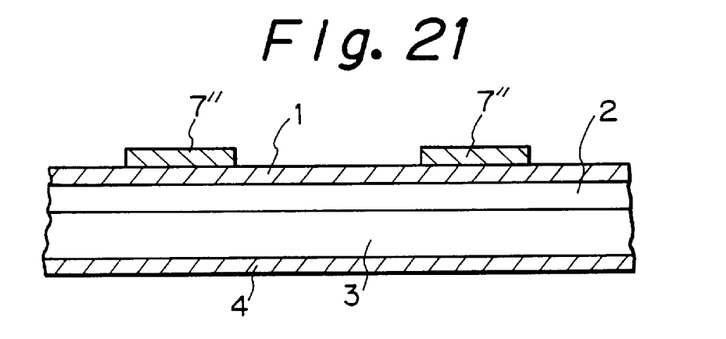
Figure 22:
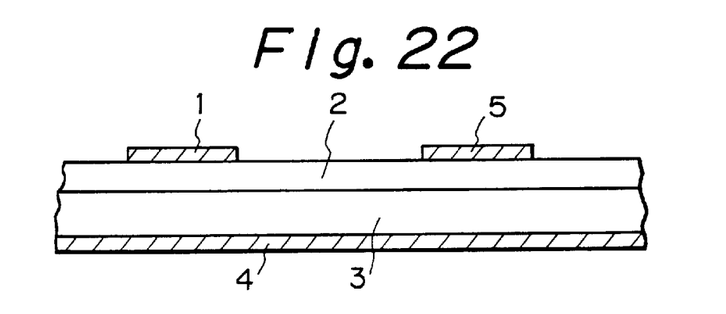

Then, a resist pattern 7" is applied to the surface of the metal layer as illustrated in FIG. 21, the metal layer is etched to form the signal transmission path 1 and the land 5, and the resist 7" is removed, as illustrated in FIG. 22.

Figure 23:
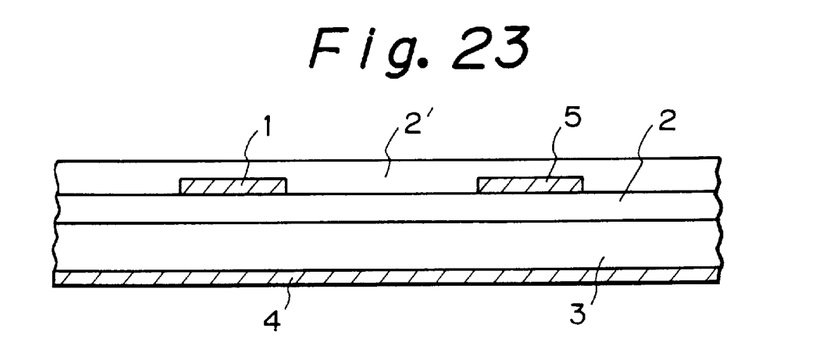
Figure 24:
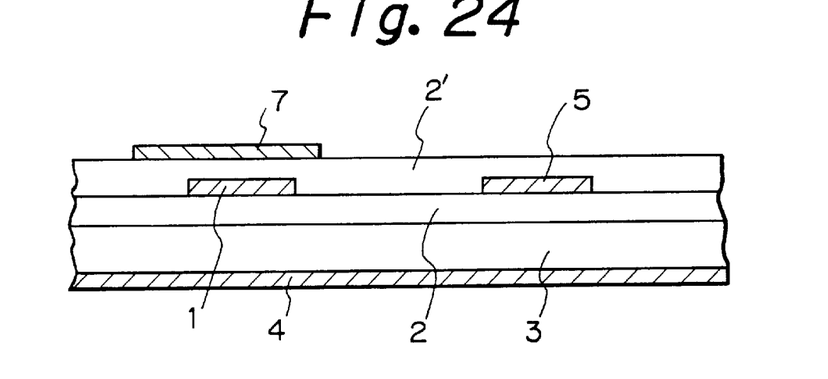
Figure 25:
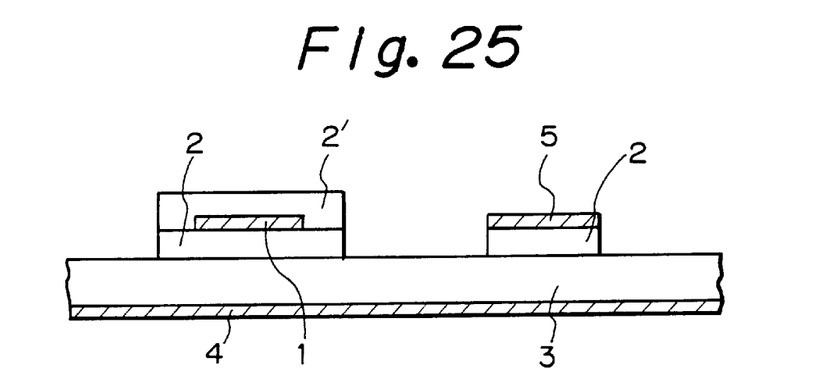

Thereafter, a low dielectric constant layer 2', which may be a same or different material to the material of the low dielectric constant layer 2, is formed on the overall surface as illustrated in FIG. 23, a resist 7 is applied to the surface of the low dielectric constant layer 2' as illustrated in FIG. 24, and then the low dielectric constant layer 2' is etched to form the signal transmission path 1 completely embedded in the material of the low dielectric constant layers 2 and 2', and the land 5 mounted on the low dielectric constant layer 2, as shown in FIG. 25, which corresponds to the step shown in FIG. 6 in the above-mentioned first process embodiment. Thereafter, the steps as illustrated in FIGS. 8 through 10 may be repeated.

As preferred examples of the low dielectric constant layer material, there may be mentioned amorphous fluoropolymers such as Teflon AF available from Du-Pont and having a dielectric constant of 1.89 to 1.93, and perfluorinated polyalkylamine polymers such as Cytop available from the Asahi Glass Company and having a dielectric constant of 2.1 to 2.2. It was found that, when these amorphous fluoro polymers or perfluorinated polyalkylamine polymers are used as the low dielectric constant material according to the present invention, a thin film circuit substrate having a dielectric constant of 2.5 to 2.7 can be obtained.

As is clear from the foregoing explanation, according to the present invention, the circumference of a signal transmission path is surrounded with a low dielectric constant insulator, whereby a substantially low dielectric constant can be obtained and signal propagation velocity can be improved.

Further, since an insulating layer with a good adhesiveness is interposed between the upper and lower conductor layers, a lowering of the interlayer adhesiveness can be prevented.

What is claimed is:

1. A multilayer conductor thin film circuit substrate, comprising:

a conductor layer forming at least one signal transmission path, each having an upper surface and a periphery;

a first insulator layer, having a first dielectric constant, selectively formed at each signal path covering substantially all of the upper surface and the periphery of each signal transmission path; and a second insulator layer, having a second dielectric constant larger than the first dielectric constant and more adhesiveness than said first insulator layer, surrounding said first insulator layer.

2. A multilayer conductor thin film circuit substrate as set forth in claim 1, wherein each signal transmission path is supported by said second insulator layer on a portion of one side of said conductor layer in an undercut state.

3. A multilayer conductor thin film circuit substrate as set forth in claim 1, wherein said conductor layer further forms a land for interlayer contact corresponding and connected to each signal transmission path, and wherein all of the upper surface and the periphery of each signal transmission path, excluding the land for interlayer contact, is surrounded by said first insulator layer.

4. A multilayer conductor thin film circuit substrate as set forth in claim 1, wherein said first insulator is formed of a material selected from the group consisting of fluorinated polymides, amorphous fluoropolymers and perfluorinated polyalkylamines.

* * * * *